US010276373B2

(12) United States Patent
Jeong et al.

(10) Patent No.: US 10,276,373 B2

(45) Date of Patent: Apr. 30, 2019

(54) METHOD OF MANUFACTURING A SEMICONDUCTOR DEVICE

(71) Applicant: Samsung Electronics Co., Ltd., Suwon-si (KR)

(72) Inventors: Yong Chul Jeong, Suwon-si (KR); Tae Kyu Lee, Pyeongtaek-si (KR); Sung Sik Park, Hwaseong-si (KR); Joon Soo Park, Seongnam-si (KR); Kwang Sub Yoon, Yongin-si (KR); Boo Hyun Ham, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 5 days.

(21) Appl. No.: 15/490,976

(22) Filed: Apr. 19, 2017

(65) Prior Publication Data

US 2018/0096840 A1 Apr. 5, 2018

(30) Foreign Application Priority Data

Oct. 5, 2016 (KR) ........................ 10-2016-0128351

(51) Int. Cl.

*H01L 21/027* (2006.01)
*G03F 7/09* (2006.01)
*G03F 7/075* (2006.01)
*G03F 7/42* (2006.01)
*H01L 21/311* (2006.01)
*H01L 21/266* (2006.01)

(Continued)

(52) U.S. Cl.

CPC ........ *H01L 21/0276* (2013.01); *G03F 7/0752* (2013.01); *G03F 7/091* (2013.01); *G03F 7/094* (2013.01); *G03F 7/427* (2013.01); *H01L 21/266* (2013.01); *H01L 21/31144* (2013.01); *H01L 21/76805* (2013.01); *H01L 21/76895* (2013.01); *H01L 21/823431* (2013.01)

(58) Field of Classification Search

CPC ........... H01L 21/0276; H01L 21/31144; G03F 7/2006; G03F 7/40; G03F 7/162; G03F 7/2037; G03F 7/2004; G03F 7/327; G03F 7/38; G03F 7/039; G03F 7/2002; G03F 7/168; G03F 7/038; G03F 7/095; G03F 7/091

See application file for complete search history.

(56) References Cited

U.S. PATENT DOCUMENTS 8,277,564 B2 10/2012 Le et al.
8,734,662 B2 5/2014 Hsu et al.

(Continued)

FOREIGN PATENT DOCUMENTS

JP 2005-150165 A 6/2005
JP 2008-300814 A 12/2008

(Continued)

*Primary Examiner* — Mohammed R Alam

(74) *Attorney, Agent, or Firm* — Muir Patent Law, PLLC

(57) ABSTRACT

A method for manufacturing a semiconductor device includes forming an etch target layer on a semiconductor substrate, forming a first photoresist pattern disposed on the etch target layer, irradiating ultraviolet (UV) light in an oxygen-containing atmosphere to remove the first photoresist pattern from the etch target layer, and forming a second photoresist pattern on the etch target layer.

13 Claims, 18 Drawing Sheets

15
14
12
11

UV
$O_2 \Rightarrow O_3$ or O'
15
14
12
11

(51) Int. Cl.
*H01L 21/768* (2006.01)
*H01L 21/8234* (2006.01)

(56) References Cited

U.S. PATENT DOCUMENTS

2005/0241673 A1 11/2005 Endo et al.
2008/0217788 A1* 9/2008 Yang ................. H01L 21/76801 257/774
2011/0079918 A1* 4/2011 Zhou ....................... G03F 7/427 257/774
2011/0306206 A1* 12/2011 Kiehlbauch ......... H01L 21/0273 438/666
2014/0256138 A1* 9/2014 Chen ................. H01L 21/67028 438/702
2015/0128991 A1* 5/2015 Brown .............. H01L 21/31133 134/1
2015/0187596 A1 7/2015 Nowling et al.
2015/0371863 A1 12/2015 Abdallah et al.
2016/0064238 A1* 3/2016 Feng ................... H01L 21/3086 438/702
2016/0126097 A1* 5/2016 Glodde ............. H01L 21/31144 438/694
2016/0190006 A1* 6/2016 Chen ................. H01L 21/32136 438/666
2016/0336173 A1* 11/2016 Hagiwara ........... H01L 21/0274
2016/0351507 A1* 12/2016 Wang .................... H01L 23/544

FOREIGN PATENT DOCUMENTS

JP 2012-004170 A 1/2012
KR 10-1996-0013145 B1 9/1996

* cited by examiner

METHOD OF MANUFACTURING A SEMICONDUCTOR DEVICE

CROSS-REFERENCE TO RELATED APPLICATION

This application claims benefit of priority under 35 USC § 119 to Korean Patent Application No. 10-2016-0128351 filed on Oct. 5, 2016 in the Korean Intellectual Property Office, the disclosure of which is incorporated herein by reference in its entirety.

BACKGROUND

1. Field

The present disclosure relates to a method of manufacturing a semiconductor device using a rework process such as photoresist or the like.

2. Description of Related Art

In a process of manufacturing a semiconductor device, for formation of a circuit pattern, an insulation pattern, and the like, using selective ion implantation, and etching, i.e. a photolithography process, has been used. For example, after a photoresist film is formed on a semiconductor substrate, a photoresist pattern used as an etch mask from the photoresist film may be formed in alight exposure and development process.

However, when applying photoresist, striation may occur or a photoresist pattern may be misaligned after light exposure. In this case, when a photoresist pattern is transferred, while the photoresist pattern is in the process of shifting, a defect in the semiconductor device may result. Therefore, a rework process of removing a misformed photoresist pattern and forming a photoresist pattern again may need to be performed. However, a removal process is complex and layers located in a lower part of a photoresist pattern are required to be removed together and to be formed again. Therefore, there has been a problem in which a rework process has not only been complex but relatively expensive as well.

SUMMARY

Exemplary embodiments provide a photoresist rework method for significantly reducing damage to a lower layer and simplifying a process and a method of manufacturing a semiconductor device using the same.

According to an exemplary embodiment, a method of manufacturing a semiconductor device includes forming an etch target layer on a semiconductor substrate, forming a first photoresist pattern disposed on the etch target layer, irradiating ultraviolet (UV) light in an oxygen-containing atmosphere to remove the first photoresist pattern from the etch target layer, and forming a second photoresist pattern on the etch target layer.

According to an exemplary embodiment, a method of manufacturing a semiconductor device includes forming a first organic hardmask layer on a semiconductor substrate, generating ozone or an oxygen radical to remove the first organic hardmask layer from the semiconductor substrate, and forming a second organic hardmask layer on the semiconductor substrate.

BRIEF DESCRIPTION OF DRAWINGS

The above and other aspects, features and other advantages of the exemplary embodiments described herein will be more clearly understood from the following detailed description, taken in conjunction with the accompanying drawings, in which.

DETAILED DESCRIPTION

Figure 1:
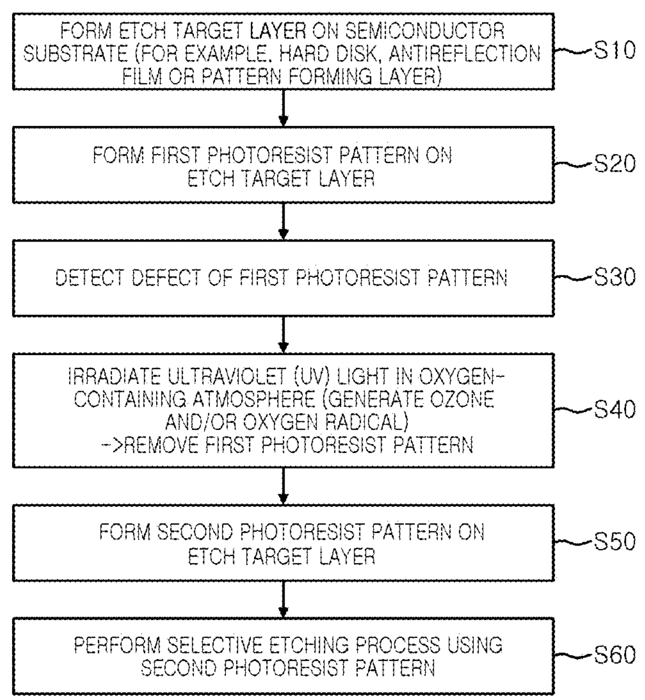
FIG. 1 is a flow chart describing a method of manufacturing a semiconductor device according to an exemplary embodiment.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly couple" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a flow chart describing a method of manufacturing a semiconductor device according to an exemplary embodiment.

As shown in FIG. 1, a process may be started with an operation (S10) of forming an etch target layer on a semiconductor substrate.

The semiconductor substrate may be a semiconductor substrate such as silicon (Si) or germanium (Ge), a compound semiconductor substrate, or a silicon on insulator (SOI) substrate. The term "etch target layer" used herein refers to a material layer to be etched below a photoresist pattern, and selectively etched by the photoresist pattern.

For example, the etch target layer may include a hardmask used for selective treatment of a different layer below a photoresist pattern. In a different example, the etch target layer may include a pattern-forming layer such as a conductive film, a dielectric film, or an insulating film, and the pattern-forming layer may be provided as a lower layer of the hardmask. The pattern-forming layer may include, for example, a metal layer, an alloy layer, a metal carbide, a metal nitride, a metal oxynitride, a metal oxycarbonate, a semiconductor, polysilicon, an oxide, a nitride, oxynitride or combinations thereof, but is not limited thereto.

Next, a first photoresist pattern is formed on the etch target layer (S20), and the first photoresist pattern is checked to determine whether the first photoresist pattern is defective (S30).

A photoresist film is formed by applying a photoresist composition in a spin coating process, followed by a soft-baking process. The photoresist film has an organic composition, and may not contain a silicon component. The photoresist film is selectively exposed with a desired pattern to be developed; thus, the photoresist film may be provided as a first photoresist pattern. An operation of checking the alignment of the first photoresist pattern is required. For example, the photoresist pattern alignment may be measured using an overlay mark. When an alignment error is significant, a rework process of removing the first photoresist pattern and forming a new photoresist pattern may be performed.

Next, ultraviolet (UV) light is irradiated in an oxygen-containing atmosphere to remove the first photoresist pattern (S40).

Ultraviolet light is irradiated to generate ozone ($O_3$) and/or an oxygen radical from oxygen. The ozone and/or the oxygen radical may react with the first photoresist pattern, formed of an organic material, to decompose the first photoresist pattern into $CO_2$ and $H_2O$. A surface area of the etch target layer, that is, a lower layer of the first photoresist pattern, may be provided not as an organic material but as a silicon compound layer or a metal layer. In this case, the first photoresist pattern does not react with the ozone and/or the oxygen radical, thereby being protected and undamaged. In a case in which plasma asking is used to remove a photoresist pattern only the photoresist pattern may not be selectively removed, while a lower layer (for example, an anti-reflection film) may be damaged. Thus, a rework process is also required to be performed on the lower layer. However, in a removal process using ultraviolet light irradiation, only a photoresist pattern, an organic material, may be selectively removed. The selective removal process will be described in detail in describing the following exemplary embodiments.

Next, a second photoresist pattern is formed on the etch target layer (S50), and the second photoresist pattern is used to selectively etch the etch target layer (S60).

A second photoresist pattern is formed on a surface of the etch target layer from which the first photoresist pattern has been removed. The process described above may be performed in a manner similar to a formation process of the first photoresist pattern. The second photoresist pattern is used to perform a subsequent process such as etching the etch target layer. For example, when the etch target layer includes a hardmask, a pattern is transferred onto the hardmask, and the hardmask is used to perform a process such as etching, ion implantation, and/or deposition, so as to manufacture a semiconductor device.

FIGS. 2A to 2F are cross-sectional views of main processes to illustrate a photoresist rework process according to an exemplary embodiment.

Figure 2A:
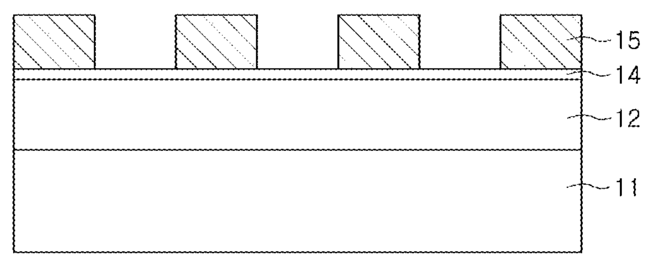
FIGS. 2A to 2F are cross-sectional views of main processes illustrating a photoresist rework process according to an exemplary embodiment.

As shown in FIG. 2A, a semiconductor substrate 11, in which a hardmask layer 12, an anti-reflection film 14, and a first photoresist pattern 15 are sequentially disposed.

The semiconductor substrate 11 may have various device isolation structures, such as an impurity-doped region or a shallow trench isolation (STI) structure. In addition, the semiconductor substrate 11 may include various substructures for the formation of a semiconductor device. For example, the substructure may be a contact area, a pad, an insulating film pattern and/or a conductive film pattern.

The etch target layer employed in an exemplary embodiment may include the hardmask layer 12 and the anti-reflection film 14.

The hardmask layer 12 may be formed of various membranes such as an organic material or an inorganic material. For example, the hardmask layer 12 may be formed of an oxide film, a nitride film, a SiCN film, a polysilicon film, an amorphous carbon layer, or a carbon-containing film such as a spin-on hardmask (SOH) material. The carbon-containing film formed of the SOH material may be formed using an organic compound having a relatively high carbon content of about 85 wt % to about 99 wt %, based on the total weight thereof. The organic compound may be formed using a hydrocarbon compound including an aromatic ring such as phenyl, benzene, naphthalene, or a derivative thereof. Hereinafter, a hardmask having an organic material as a main component, such as a SOH material, will be referred to as an "organic hardmask".

Figure 2B:
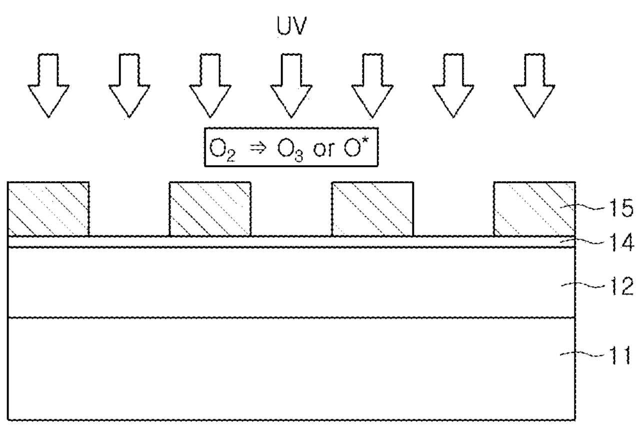
Figure 2C:
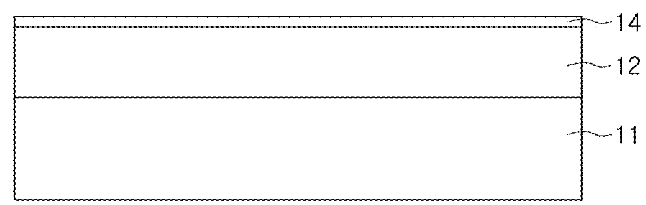
Figure 2D:
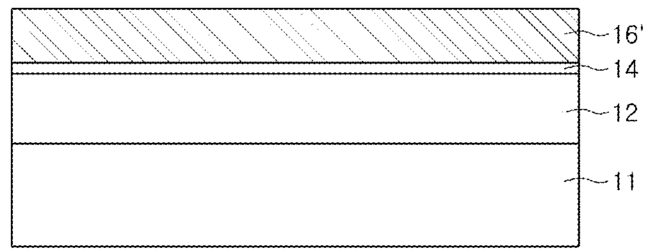
Figure 2E:
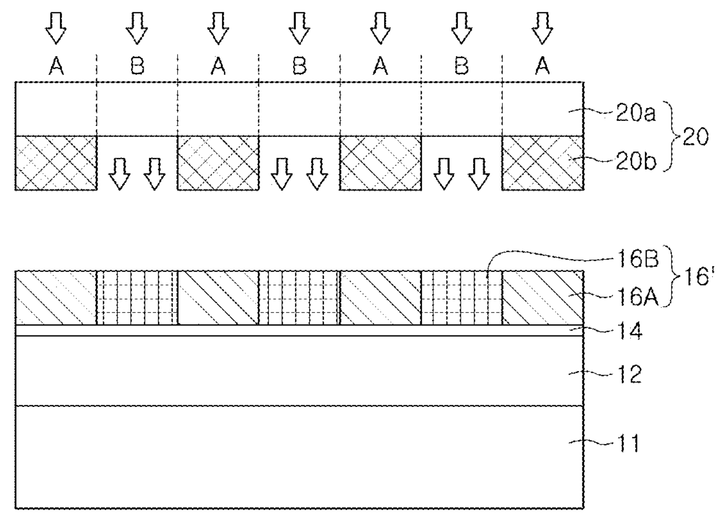

The anti-reflection film 14 may control that the light used during exposure for manufacturing a semiconductor device is diffuse-reflected (referring to FIG. 2E). Alternatively, the anti-reflection film 14 may serve to absorb reflected light from a lower layer thereof.

The anti-reflection film 14 may be formed of a material selectively removable from the first photoresist pattern 15, formed of an organic material. The anti-reflection film 14 may be an inorganic anti-reflection film, or may be an anti-reflection film containing a relatively small amount of silicon, even when an organic compound is included therein. In the anti-reflection film containing silicon, the total amount of an organic material may be limited to being a relatively small amount. For example, the content of carbon may be 10 wt % or less, while the content of silicon may be 17 wt % to about 43 wt %. The inorganic anti-reflection film may be formed using, for example, an inorganic material, such as titanium, titanium dioxide, titanium nitride, chromium oxide, carbon, silicon nitride, silicon oxynitride, amorphous silicon, and the like. In some exemplary embodiments, the inorganic anti-reflection film may be provided as a combination with the organic anti-reflection film (shown in FIGS. 8A to 8C).

The first photoresist pattern 15 may be manufactured by dissolving a photoresist material in an organic solvent. The photoresist composition may further include a photo-acid generator (PAG) or a sensitizer. The photoresist material may include a positive-type high molecular substance in which crosslinking of an exposed part is decomposed, or in which a protecting group bound to a backbone chain is removed therefrom.

The backbone chain may include a polymer chain such as novolac, polystyrene, polyhydroxystyrene (PHS), polyacrylate, polymethacrylate, polyvinylester, polyvinylether, polyolefin, polynorbornene, polyester, polyamide, and polycarbonate, while the protecting group may include, for example, an acetal group, an ether group, a thioether group, or the like. Alternatively, the photoresist material may include a negative-type high molecular substance in which crosslinking is generated to be hardened in an exposed part.

As described above, the first photoresist pattern 15 may include an organic compound, and may ensure sufficient selectivity to the anti-reflection film 14, the lower layer described previously. To prevent a residue from remaining after being UV-irradiated, the first photoresist pattern 15 may not contain an inorganic component such as Si.

As illustrated in FIGS. 2B and 2C, ultraviolet (UV) light is irradiated in an oxygen-containing atmosphere to selectively remove the first photoresist pattern 15.

In the case of an oxygen-containing atmosphere, additional oxygen may be intentionally supplied to maintain a high oxygen fraction. However, in the case of an air atmosphere, desired ozone ($O_3$) and/or a desired oxygen radical may be sufficiently generated by ultraviolet light irradiation (shown in FIG. 2B). Ultraviolet light used in the process described above may have a wavelength capable of generating ozone, for example, 184.9 nm. The ozone and/or the oxygen radical generated by the ultraviolet light irradiation may react with the first photoresist pattern 15. As a result, the ozone and/or the oxygen radical is decomposed into $CO_2$ and $H_2O$, thereby removing the first photoresist pattern 15 from the anti-reflection film 14. The process described above may be performed at room temperature, but may also be performed in a range of about 100° C. to about 400° C. in consideration of the desired reaction rate.

As described previously, the anti-reflection film 14 employed in an exemplary embodiment may be an inorganic anti-reflection film or an anti-reflection film containing silicon. Under the conditions described above, in a UV irradiating process, while the anti-reflection film 14 is not damaged, only the first photoresist pattern 15, an organic material, may be selectively removed (shown in FIG. 2C).

Next, a second photoresist pattern 16 may be formed on the anti-reflection film 14. A process described above may be performed in a manner similar to a formation process of the first photoresist pattern 15. Hereinafter, the photoresist composition will be described by way of example of using the positive-type high molecular substance.

First, as illustrated in FIG. 2D, a photoresist film 16' is formed on an upper surface of the anti-reflection film 14, from which the first photoresist pattern 15 has been removed. The photoresist film 16' may be formed using an organic solvent in which the photoresist composition described above is dissolved, and may be formed in a spin coating process and a soft-baking process. The soft-baking process may be, for example, performed using a hot plate. The soft-baking process may be performed at a temperature of about 30° C. to about 100° C., but a required temperature may be different according to a type of organic solvent.

Next, as illustrated in FIG. 2E, an exposure mask 20 is used to perform a light exposure process on the photoresist film 16'.

The exposure mask 20 includes a transparent substrate 20*a* and a light shield pattern 20*b*, and may have a light shield area A formed by the light shield pattern 20*b* and a floodlighting area B. The photoresist film 16 may be divided into a non-exposed area 16A and an exposed area 16B, due to selective light exposure using the exposure mask. A portion of the photoresist film 16,' excluding the exposed area 16B, may be defined as the non-exposed area 16A. Acid ($H^+$) may be generated by the photoacid generator included in the photoresist composition in the exposed area 16B. A light source used for the light exposure process may be, for example, an argon fluoride (ArF) laser, a krypton fluoride (KrF) laser, an electron beam, I-line, an extreme ultraviolet (EUV) light source, and the like, but is not limited thereto. A post exposure baking (PEB) process may be performed on the photoresist film 16'.

Figure 2F:
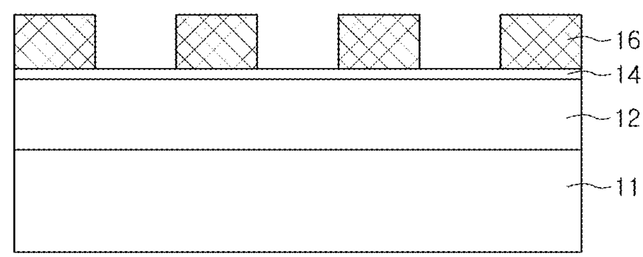

Next, as illustrated in FIG. 2F, a developer is used to selectively remove the exposed area 16B. Thus, a second photoresist pattern 16 may be defined by the non-exposed area 16A remaining on the anti-reflection film 14.

A developer used in the process described above may include, for example, an alcohol-based solution or a hydroxide-based solution such as a tetra methyl ammonium hydroxide (TMAH) solution. As described above, the exposed area 16B may be converted into a pattern having significantly higher polarity and/or hydrophile properties in comparison with the non-exposed area 16A, in the light exposure process and the PEB process. Thus, only the exposed area 16B may be selectively removed by a polar solution such as the TMAH solution.

In some exemplary embodiments, after the development process, a hard-baking process may be further performed. A second photoresist pattern 16 may be further hardened in the hard-baking process. The hard-baking process may be performed at a temperature of about 100° C. to about 200° C. and may include heat treatment using a hot plate. In a manner different from the exemplary embodiment, in a case in which the photoresist material is a negative-type material, the non-exposed area 16A may be selectively removed in the development process.

Another exemplary embodiment, involves a case in which UV light is used to selectively remove only the first photoresist pattern 15, while the anti-reflection film 14 remains as it is. However, after the anti-reflection film 14 or the anti-reflection film 14 and the hardmask layer 12 are removed in a strip and asking process, a new hardmask layer and a new anti-reflection film may be formed thereon.

Figure 3A:
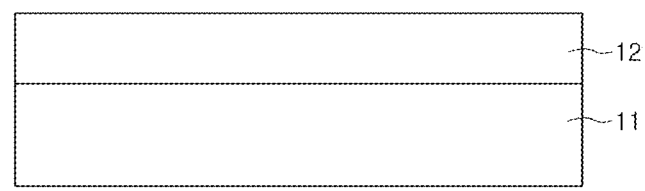
FIGS. 3A to 3C are cross-sectional views of main processes illustrating a process of forming the photoresist illustrated in FIG. 2A.
Figure 3B:
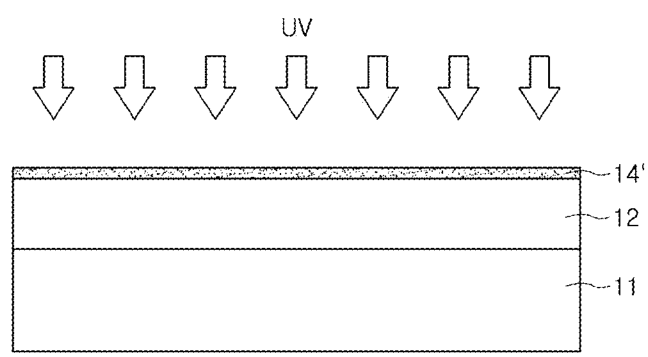
Figure 3C:
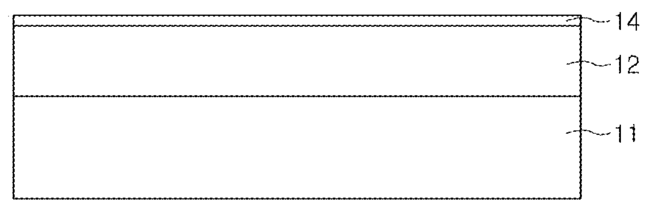

FIGS. 3A to 3C are cross-sectional views of a main process illustrating a formation method of the structure illustrated in FIG. 2A.

As illustrated in FIG. 3A, a hardmask layer 12 is formed on a semiconductor substrate 11.

The hardmask layer 12 may be formed of a carbon-containing film formed of an SOH material, that is, an organic compound having a relatively high carbon content, such as a carbon-SOH (C—SOH) material. The hardmask layer 12 may be formed on the semiconductor substrate 11 by spin coating. The hard mask layer 12 may be formed on the semiconductor substrate 11 at a thickness of 1000 Å to 10000 Å.

As illustrated in FIG. 3B, the hardmask layer 12 is coated with an anti-reflection film 14'.

The anti-reflection film 14' employed in an exemplary embodiment may be a silicon-containing anti-reflective coating (Si-ARC) film. In the Si-ARC film, the carbon content is limited, to ensure selectivity when a photoresist, an organic material, is removed. For example, the content of carbon may be 10 wt % or less. In the case in which a limited amount of organic material is included, when UV light is irradiated for removal of a photoresist the organic material may be only slightly affected (for example, reduction in a thickness).

As described above, to significantly reduce the effect of UV light in a subsequent process, as illustrated in FIG. 3C, the anti-reflection film 14 is baked using ultraviolet light in an oxygen-containing atmosphere.

In a UV baking process, a small amount of an organic component contained in an anti-reflection film is decomposed in advance. In this case, even when UV etching is additionally applied in a subsequent process, the resulting effect may be significantly reduced (referring to Experimental Example 2). The UV baking may be performed under conditions the same as or similar to subsequent UV etching.

The ultraviolet light used in the process described above may have a wavelength capable of generating ozone, for example, 184.9 nm. The UV baking may be performed at room temperature, or at a range of about 100° C. to about 400° C., in consideration of a desired reaction rate.

In an exemplary embodiment, a hardmask provided as an etch target layer is patterned by a photoresist pattern, and a patterned hardmask is used to perform a process such as etching, ion implantation and/or deposition, for manufacturing a semiconductor device. An example of a semiconductor process performed after rework is illustrated in FIGS. 4A to 4C (ion implantation) and FIGS. 5A to 5E (selective deposition/etching).

Figure 4A:
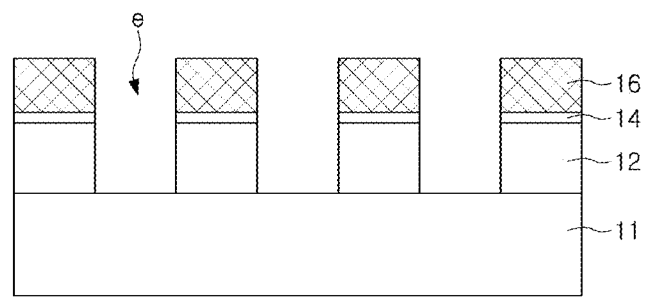
FIGS. 4A to 4C are cross-sectional views of main processes illustrating a method of manufacturing a semiconductor device according to an exemplary embodiment (for example, ion implantation)
Figure 4B:
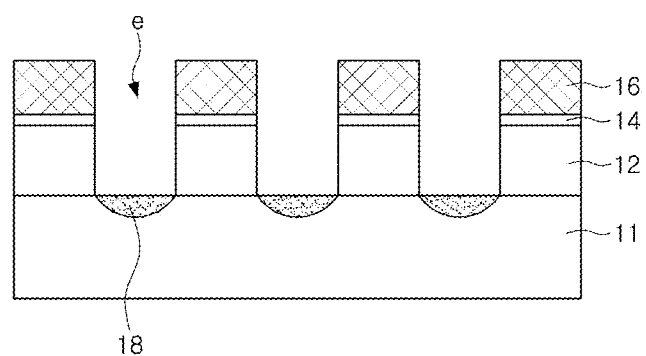
Figure 4C:
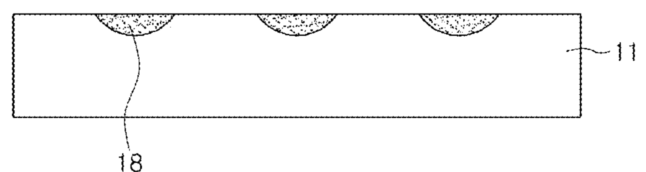

FIGS. 4A to 4C are cross-sectional views of a main process, illustrating a method of manufacturing a semiconductor device according to an exemplary embodiment (for example, ion implantation).

As shown in FIG. 4A, a second photoresist pattern 16 provided in a rework process is used to selectively etch an anti-reflection film 14 and a hardmask layer 12. In a process described above, the hardmask layer 12 may have an opening e exposing a partial area of a semiconductor substrate 11. An area exposed by the opening may be provided as a processed area to which an additional process is applied.

As shown in FIG. 4B, the hardmask layer 12 is used as an ion implantation mask along with the second photoresist pattern 16 to perform an ion implantation process.

An n-type or p-type impurity may be injected into an exposed area of the semiconductor substrate 11, and a desired impurity region 18 may be formed on an upper part of the semiconductor substrate 11. The impurity region 18 may have an island shape or a line shape when viewed from the top. In a process described above, the second photoresist pattern 16 may be hardened after ion implantation.

As illustrated in FIG. 4C, the hardened second photoresist pattern 16, the anti-reflection film 14, and the hardmask layer 12 may be removed.

In a removal process, the second photoresist pattern, the anti-reflection film, and the hardmask layer may be removed in an ashing and/or strip process using plasma. In some example embodiments, ultraviolet (UV) light is irradiated in an oxygen-containing atmosphere to remove the second photoresist pattern 16 and the hardmask layer 12 formed using a C—SOH material. In detail, in a rework process, in a manner similar to a process of removing a first photoresist pattern, ozone ($O_3$) and/or an oxygen radical is generated to react with the second photoresist pattern 16, thereby decomposing the second photoresist pattern 16 into $CO_2$ and $H_2O$. In this case, an ashing process for removal of the anti-reflection film 14 may be additionally applied.

FIGS. 5A to 5E are cross-sectional views of a main process, illustrating a method of manufacturing a semiconductor device according to an exemplary embodiment (for example, contact formation).

Figure 5A:
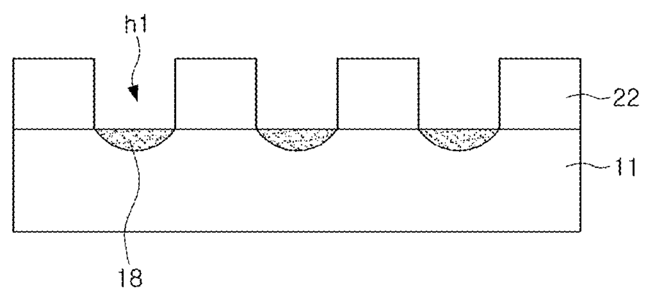
FIGS. 5A to 5F are cross-sectional views of main processes illustrating a method of manufacturing a semiconductor device according to an exemplary embodiment (for example, contact formation)

As shown in FIG. 5A, an insulating layer 22 having a plurality of first contact holes h1 is disposed on a semiconductor substrate 11.

The insulating layer 22 employed in an exemplary embodiment may be a film partially etched in a photolithography process. In a manner similar to the process illustrated in FIG. 4B, in an upper part of the semiconductor substrate 11, the impurity region 18 may be formed using the insulating layer 22 as an ion implantation mask. This example embodiment may be understood as being obtained by using the insulating layer 22 provided as a structure of a semiconductor device, instead of using the hardmask layer 12 among etch target layers, in processes of FIGS. 4A to 4C.

The insulating layer 22 may be formed to include a silicon oxide-based insulating material. For example, the insulating layer 22 may include a silicon oxide-based material such as plasma enhanced oxide (PEOX), TetraEthyl OrthoSilicate (TEOS), Boro TetraEthyl OrthoSilicate (BTEOS), Phosphorous TetraEthyl OrthoSilicate (PTEOS), Boro Phospho TetraEthyl OrthoSilicate (BPTEOS), Boro Silicate Glass (BSG), Phospho Silicate Glass (PSG), Boro Phospho Silicate Glass (BPSG), and the like. The insulating layer 22 may be formed by means of, for example, a chemical vapor deposition (CVD) process, a plasma enhanced chemical vapor deposition (PECVD) process, an atomic layer deposition (ALD) process, a thermal oxidation process on an upper surface of the semiconductor substrate 11 or the like.

Figure 5B:
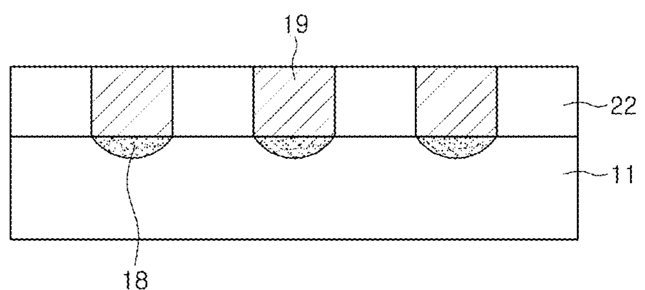

As illustrated in FIG. 5B, a first conductive pattern 19 may be formed on a first contact hole h1 of the insulating layer 22.

In a process described above, after a conductive material layer is formed to fill the first contact hole h1, the conductive material layer is planarized until an upper surface of the insulating layer 22 is exposed, to form the first conductive pattern 19. A planarization process may be a chemical mechanical polish (CMP) process. For example, the first conductive pattern 19 may be formed using a metal such as copper, tungsten, aluminum, or the like. The first conductive pattern 19 may have a pillar-shaped contact or wire shape.

Figure 5C:
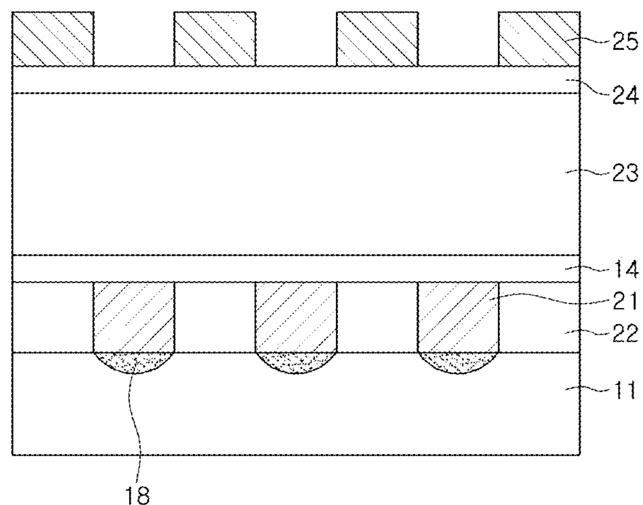

As illustrated in FIG. 5C, an etch stop film 21 and an etching target film 23 may be formed above the insulating layer 22 and the first conductive pattern 19, while an anti-reflection film 24 and a first photoresist pattern 25 may be formed on the etching target film 23.

The etch stop film 21 may be formed to include, for example, silicon nitride or silicon oxynitride. The etching target film 23 may include a silicon oxide-based material the same as or similar to that of the insulating layer 22. The etch stop film 21 and the etching target film 23 may be formed by means of, for example, a CVD process, a PECVD process or an ALD process.

Each of the anti-reflection film 24 and the first photoresist pattern 25 may be formed using a composition described above. The anti-reflection film 24 and the first photoresist pattern 25 may be formed by spin coating and soft-baking using, for example, a hot plate.

Figure 5D:
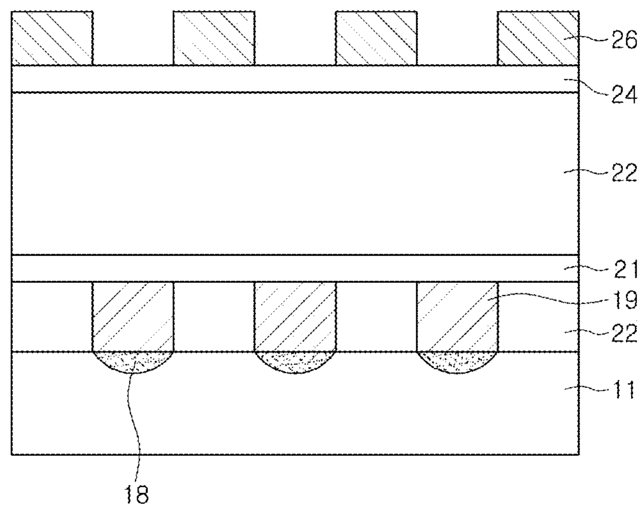

As illustrated in FIG. 5D, when the first photoresist pattern 25 is determined as being misaligned, in a manner similar to the process illustrated in FIGS. 2A to 2E, UV etching is used to remove the first photoresist pattern 25, and a second photoresist pattern 26 may be formed on the anti-reflection film 24 remaining as it is.

Figure 5E:
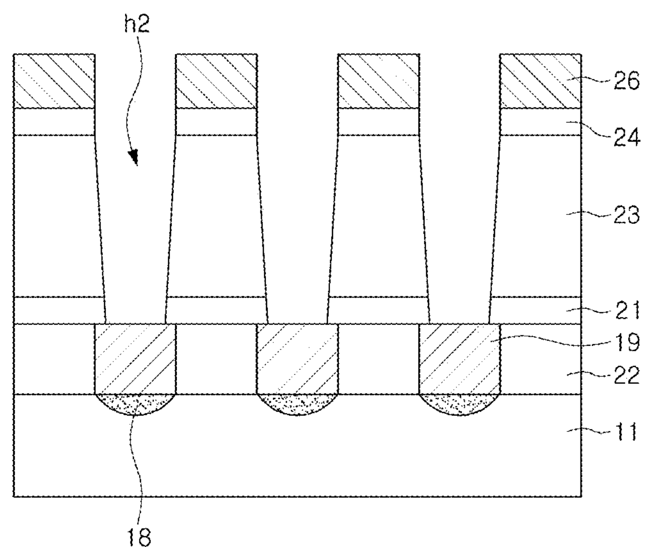

As illustrated in FIG. 5E, the second photoresist pattern 26 is used to partially etch the anti-reflection film 24, the etching target film 23, and the etch stop film 21, thereby forming a second contact hole h2.

In some exemplary embodiments, upper surfaces of a plurality of first conductive patterns 19 may be exposed by the second contact hole h2. After the second contact hole h2 is formed, the second photoresist pattern 26 and the anti-reflection film 24 may be removed in an asking process and/or a strip process.

Figure 5F:
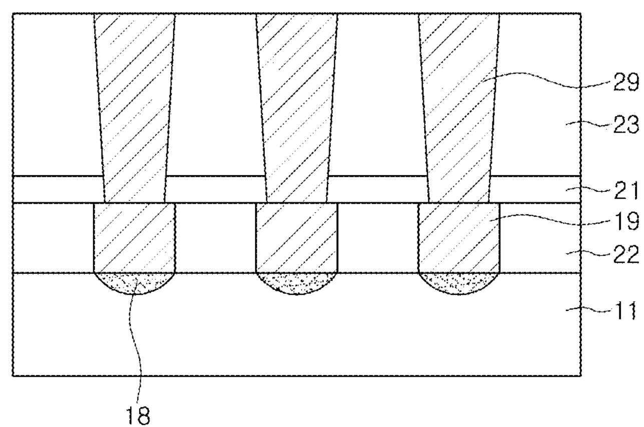

As shown in FIG. 5F, a second conductive pattern 29, filling the second contact hole h2, may be formed.

In an exemplary embodiment, the second conductive material layer, filling a plurality of second contact holes h2, may be formed on the etching target film 23, and the second conductive material layer is planarized until an upper surface of the etching target film 23 is exposed, thereby forming the second conductive pattern 29. The second conductive pattern 29 may be formed using a metal, such as, copper, aluminum, tungsten, and may be formed in a sputtering process or an ALD process.

In some exemplary embodiments, before the second conductive material layer is formed, a barrier film (not shown) may be formed to be conformal on an inner wall of the second contact hole h2. The barrier film may include metal nitride such as titanium nitride or tantalum nitride.

In some exemplary embodiments, the second conductive material layer may be formed in a plating process. For example, in a sputtering process using a copper target, a seed layer is conformally formed on the barrier conductive film, and a plating layer may be formed on the seed layer. The second conductive pattern 29 formed in a process described above may be provided as a plug electrically connected to each first conductive pattern 19. The second conductive pattern 29 may be provided as an upper wiring electrically connected to the plurality of first conductive patterns 19.

In some exemplary embodiments, a metal such as aluminum or molybdenum is used to further form a capping film covering an upper surface of the second conductive pattern 29.

A rework process according to an exemplary embodiment may be performed in various ways, and may be used as a rework process (FIGS. 6A to 6C) for a hardmask layer.

Figure 6A:
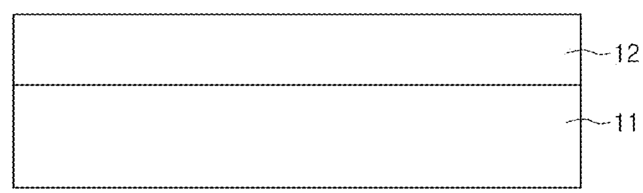
FIGS. 6A to 6C are cross-sectional views of main processes illustrating a photoresist rework process according to an exemplary embodiment.
Figure 6B:
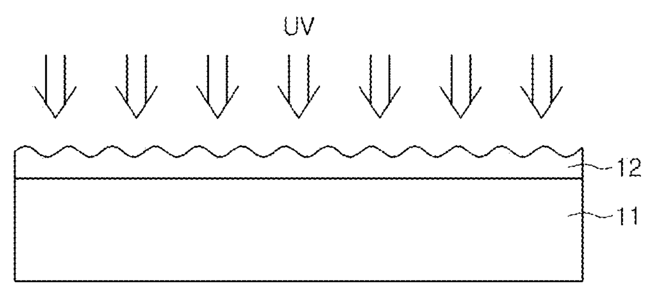
Figure 6C:
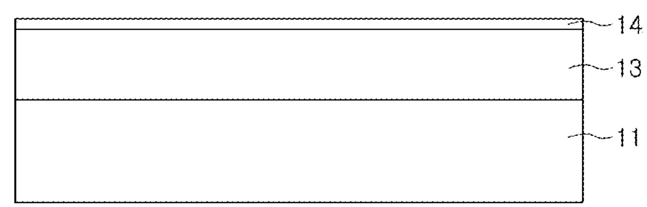

FIGS. 6A to 6C are cross-sectional views of a main process illustrating a photoresist rework process according to an exemplary embodiment.

As illustrated in FIG. 6A, a first hardmask layer 12, an etch target layer, may be formed on a semiconductor substrate 11.

The first hardmask layer 12 employed in an example embodiment may be an organic hardmask formed of a SOH material containing carbon. In an example embodiment, before an anti-reflection film is formed, a defect of the hardmask layer 12 may occur, whereby a reworking of a hardmask layer may be performed.

As illustrated in FIG. 6B, ozone or an oxygen radical is generated to remove the first hardmask layer 12 from the semiconductor substrate 11.

Since the first hardmask layer 12 is an organic hardmask layer, the first hardmask layer may react with the ozone or the oxygen radical, causing the hardmask layer to be decomposed. The ozone or the oxygen radical may be formed by irradiating ultraviolet light in an oxygen-containing atmosphere (for example, an atmosphere). In a decomposition process described above, damage to a surface of the semiconductor substrate 11 or a substructure may be significantly reduced.

As illustrated in FIG. 6C, after the first hardmask layer 12 is removed, a second hardmask layer 13 and an anti-reflection film 14 may be sequentially formed on the semiconductor substrate 11.

The second hardmask layer 13 may be formed of a mask material the same as the first hardmask layer 12. The anti-reflection film 14 employed in an exemplary embodiment is not limited to being a material selectively removable from a photoresist pattern to be formed thereabove, and may include an organic anti-reflection film or an inorganic anti-reflection film. In addition, similarly to the photoresist rework process described in the previous exemplary embodiment herein described, the anti-reflection film 14 may be a material selectively removable from a photoresist pattern formed of an organic material.

Figure 7A:
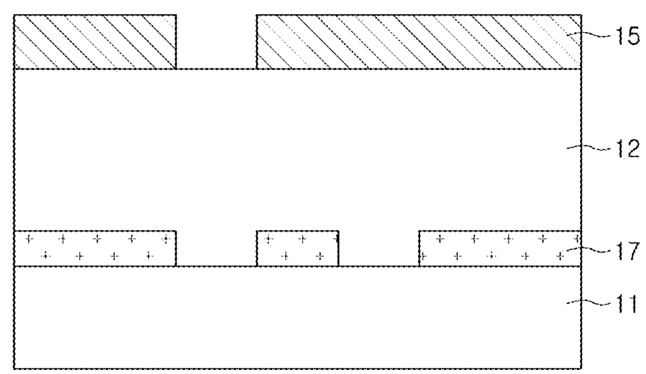
FIGS. 7A to 7C are cross-sectional views of main processes illustrating a photoresist rework process according to an exemplary embodiment.
Figure 7B:
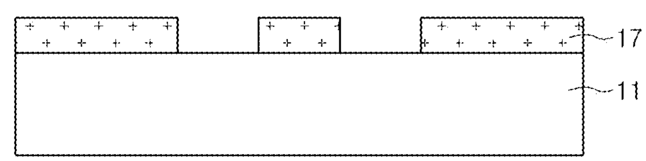
Figure 7C:
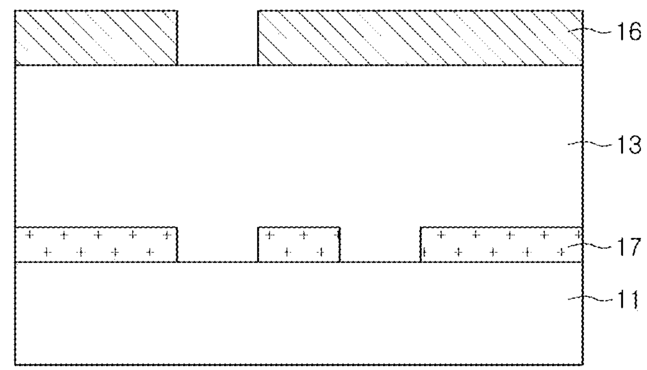

FIGS. 7A to 7C are cross-sectional views of a main process illustrating a photoresist rework process according to an exemplary embodiment.

As shown in FIG. 7A, a first hardmask layer 12 is included as an etch target layer. In a manner different from the previous exemplary embodiment, a first photoresist pattern 15 may be directly formed on the first hardmask layer 12 without an anti-reflection film. When a relatively large pattern is formed, an anti-reflection film may be omitted, in a manner the same as this exemplary embodiment.

In the exemplary embodiment, the first hardmask layer 12 may be an organic hardmask layer, similar to the previous exemplary embodiment. A substructure 17, for the formation of a semiconductor device, may be provided on a semiconductor substrate 11. For example, the substructure 17 may be a contact area, a pad, an insulating film pattern, and/or a conductive film pattern. The substructure 17 may be a structure not containing an organic material or containing only a small amount of an organic material. When a defect of the first photoresist pattern 15 occurs, a rework process illustrated in FIGS. 7B and 7C may be performed.

As illustrated in FIG. 7B, ozone or an oxygen radical is generated to remove the first hardmask layer 12, an organic material, from the semiconductor substrate 11, along with the first photoresist pattern 15 having the defect. In the decomposition process described above, damage to the substructure 17, such as a silicon compound layer or a metal layer, may not occur.

As illustrated in FIG. 7C, after the first hardmask layer 12 is removed, a second hardmask layer 13 and a second photoresist pattern 16 may be sequentially formed on the semiconductor substrate 11. Each of the second hardmask layer 13 and the second photoresist pattern 16 may be formed of the same mask material as each of the first hardmask layer 12 and the first photoresist pattern 15, respectively.

Figure 8A:
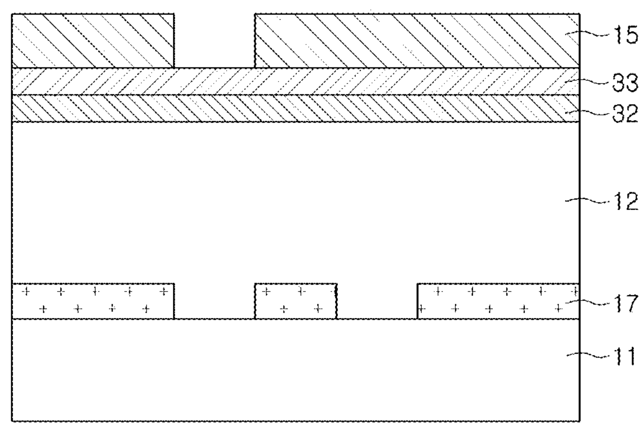
FIGS. 8A to 8C are cross-sectional views of main processes illustrating a hardmask rework process according to an exemplary embodiment.
Figure 8B:
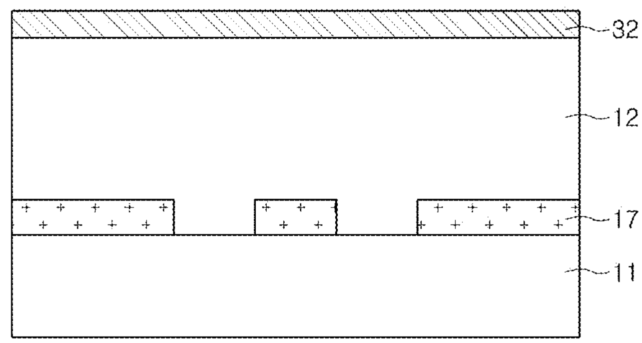
Figure 8C:
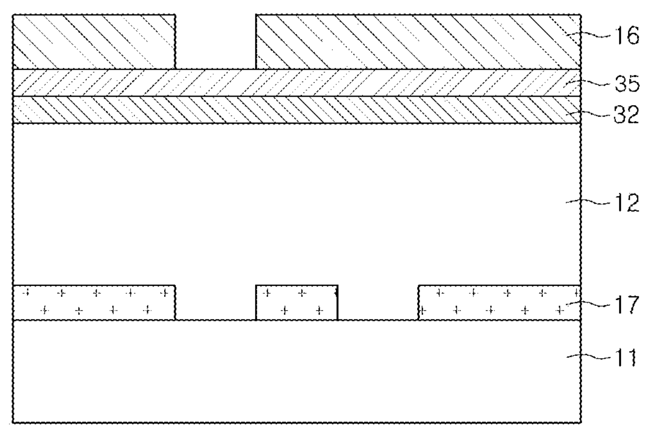

FIGS. 8A to 8C are cross-sectional views of a main process illustrating a hardmask rework process according to an exemplary embodiment.

As shown in FIG. 8A, a hardmask layer 12, an inorganic anti-reflection film 32, a first organic anti-reflection film 33, and a first photoresist pattern 15 are formed on a semiconductor substrate 11.

A reflective structure employed in an exemplary embodiment may be a combination of the inorganic anti-reflection film 32 and the first organic anti-reflection film 33. The inorganic anti-reflection film 32 may be formed of an inorganic material, such as titanium, titanium dioxide, titanium nitride, chromium oxide, carbon, silicon nitride, silicon oxynitride, amorphous silicon, or the like. The first organic anti-reflection film 33 may be formed of a material not dissolved by a negative tone developer or having significantly low solubility due to a negative tone developer. The first organic anti-reflection film 33 may be included as an amount selected within a range of about 1 mol % to about 40 mol %, based on a total amount of a polymer.

In a specific example, the inorganic anti-reflection film 32 is formed of silicon oxynitride (SiON), and the first organic anti-reflection film 33 may be formed of a bottom anti-reflection coating (BARC) composition. When a defect of the first photoresist pattern 15 occurs, a rework process illustrated in FIGS. 8B and 8C may be performed.

As illustrated in FIG. 8B, ozone or an oxygen radical is generated to remove the first photoresist pattern 15 having a defect, along with the first organic anti-reflection film 33 from the inorganic anti-reflection film 32. In a decomposition process described above, a surface of the inorganic anti-reflection film 32 may not be damaged by the ozone or the oxygen radical.

As illustrated in FIG. 8C, the inorganic anti-reflection film 32 is used as it is to sequentially form thereon a second organic anti-reflection film 35 and a second photoresist pattern 16. Each of the second organic anti-reflection film 35 and the second photoresist pattern 16 may be formed of a mask material the same as each of the first organic anti-reflection film 33 and the first photoresist pattern 15, respectively.

FIGS. 9A to 9D are cross-sectional views of a main process illustrating a method of manufacturing a semiconductor device according to an exemplary embodiment.

Figure 9A:
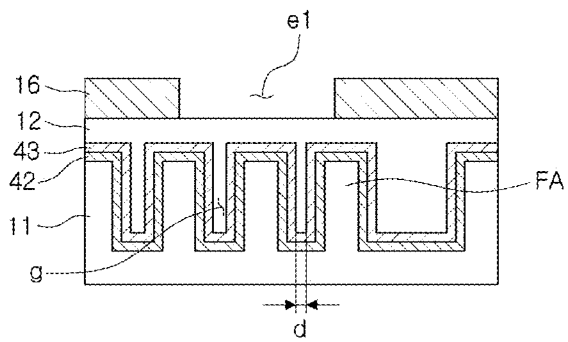
FIGS. 9A to 9D are cross-sectional views of main processes illustrating a method of manufacturing a semiconductor device according to an exemplary embodiment.

As shown in FIG. 9A, a semiconductor substrate 11, in which a fine pattern FA is formed in an upper surface thereof, is illustrated.

On the upper surface of the semiconductor substrate 11, a first material layer 42 and a second material layer 43 may be sequentially formed in the shape of the fine pattern FA. In terms of composition, the first material layer 42 and the second material layer 43 may be a metal layer or a metal compound layer, for example. The fine pattern FA may have a thin line width (for example, less than several tens of nm), and may be arranged at narrow intervals (for example, about 10 nm). Further, in terms of structure, the fine pattern FA may be a protruding pin structure of a fin field effect transistor (FinFET), for example.

In an exemplary embodiment, the second material layer 43 may be an etch target layer. To pattern the second material layer 43, a hardmask layer 12 and a photoresist pattern 16 are sequentially formed on the second material layer 43. The photoresist pattern 16 may have a first opening e1, defining an etch area of the second material layer 43.

Figure 9B:
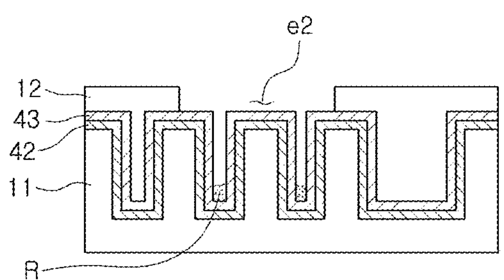

As shown in FIG. 9B, the photoresist pattern 16 is used as a mask to etch the hardmask layer 12.

A hardmask layer 12', patterned in an etching process, may have a second opening e2, exposing an area of the second material layer 43 to be etched. The etching process may be an etching process using plasma. In the etching process, a by-product R may remain in a space g between fine patterns FA. As a distance d between the fine patterns FA is narrow, the possibility for the by-product not to be removed but to remain in the space g between the fine patterns FA may be increased. The by-product includes a material forming the hardmask layer 12, which may cause a defect in which a portion of a second material layer located in the space g is not removed in a subsequent process.

Figure 9C:
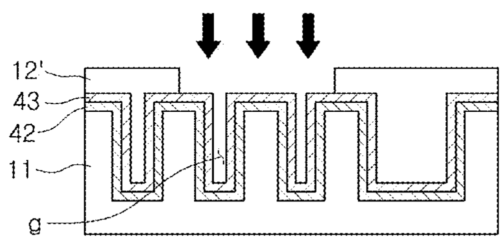

As shown in FIG. 9C, to remove the by-product R remaining in the space g between the fine patterns FA, ultraviolet (UV) light is irradiated in an oxygen-containing atmosphere.

The ultraviolet light is irradiated to generate ozone ($O_3$) and/or an oxygen radical from oxygen, and the ozone and/or the oxygen radical may be penetrated through the narrow space g between the fine patterns FA to effectively decompose the by-product R, an organic material. Conditions of the process may be implemented referring to an example of the process described previously.

Figure 9D:
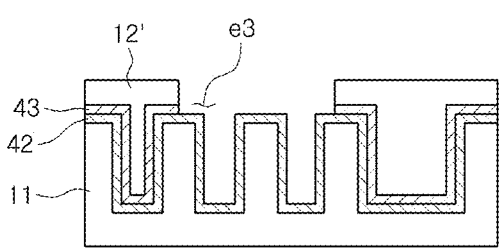

After the by-product R located between the fine patterns FA is removed, as illustrated in FIG. 9D, the hardmask layer 12' is used as a mask to selectively remove the second material layer 43. In a process described above, the second material layer 43, having a third opening e3 corresponding to the first opening e1 of the photoresist pattern 16, may be formed. Since the by-product R is removed in the previous process, a portion of a second material layer located in the space g between the fine patterns FA may be removed easily. As a result, a desired, precise patterning process may be performed.

Experiments were performed to confirm the selectivity of UV etching employed in the previous exemplary embodiments.

Experimental Example 1: Effect on a Photoresist Film

Figure 10A:
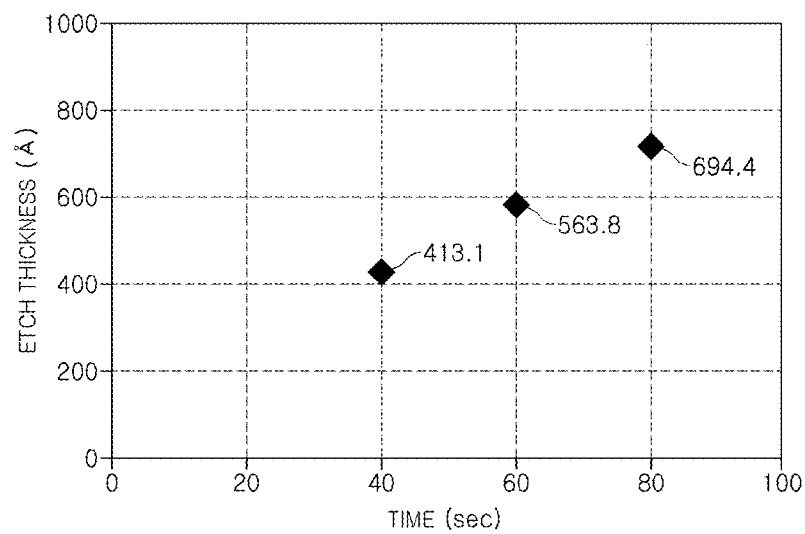
FIGS. 10A and 10B are graphs for describing a selective removal effect of an organic material using UV etching employed in an exemplary embodiment.

After a photoresist film having a thickness of about 800 Å was formed, the film was maintained in an open air atmosphere at 300° C., ultraviolet light having a wavelength of 184.9 nm was irradiated onto the film. An etch thickness of a photoresist film, generated due to ozone or an oxygen radical, was measured according to the elapsed time (40 seconds, 60 seconds, and 80 seconds). As illustrated in FIG. 10A, the photoresist film was confirmed to be etched at a thickness of 413 Å, 563 Å, and 694 Å. As described above, the occurrence of ozone is confirmed to effectively remove a photoresist film having a thickness of several hundreds of Å.

Experimental Example 2: Effect on an Anti-Reflection Film

A silicon-containing ARC composition was used to form an anti-reflection film A1 having a thickness of about 320 Å. While a thickness was measured after UV baking, the baking time was different.

In detail, while an anti-reflection film was maintained in an air atmosphere at 300° C., ultraviolet light having a wavelength of 184.9 nm was irradiated for 2 minutes, minutes, 6 minutes, and 8 minutes. Thicknesses of anti-reflection films A2, A3, A4, and A5 after UV baking are illustrated in a graph of FIG. 10B, along with thicknesses before UV baking.

Figure 10B:
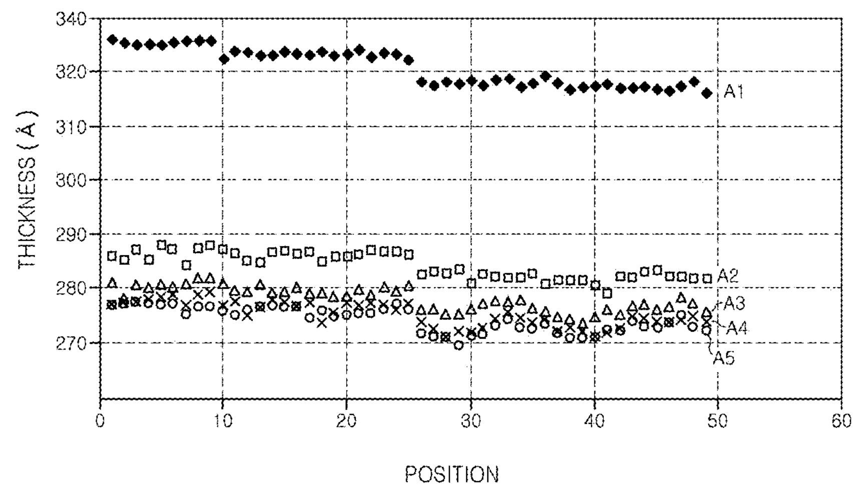

With reference to FIG. 10B, when irradiating A2 for 2 minutes, a thickness of about 3 nm to about 4 nm was reduced in comparison with A1. When irradiating A3 for 4 minutes, a thickness of about 4 nm to about 5 nm was reduced in comparison with A1; in other words, about 1 nm was additionally reduced in comparison with A2. However, when irradiating A4 and A5 for 6 minutes and 8 minutes, the thicknesses were not substantially reduced, in comparison with a case of irradiating A3 for 4 minutes. When ultraviolet baking for about 4 minutes was applied and further ultraviolet light is additionally irradiated, no change in the thickness of the anti-reflection film was substantially confirmed.

As described above, before a photoresist pattern was formed, UV baking is performed on an anti-reflection film, whereby an effect on the anti-reflection film due to UV etching for removal of a photoresist pattern was confirmed to be significantly reduced.

Experimental Example 3: Comparing to Dry Etching

In a process, in which after a vertical pattern was formed on a silicon substrate under the same conditions, a C—SOH composition was used to form a hardmask layer at a thickness of about 200 nm, two samples, a first sample B1 and a second sample B2, were prepared. While a hardmask layer was removed from each sample, the first sample B1 was maintained at 300° C. in an air atmosphere, and ultraviolet light having a wavelength of 184.9 nm was irradiated; the second sample B2 was dry etched using plasma in a $N_2/H_2$ mixed gas atmosphere. As described above, different processes were used to remove a hardmask layer, and a state of a vertical pattern was photographed.

Figures 11A, 11B:
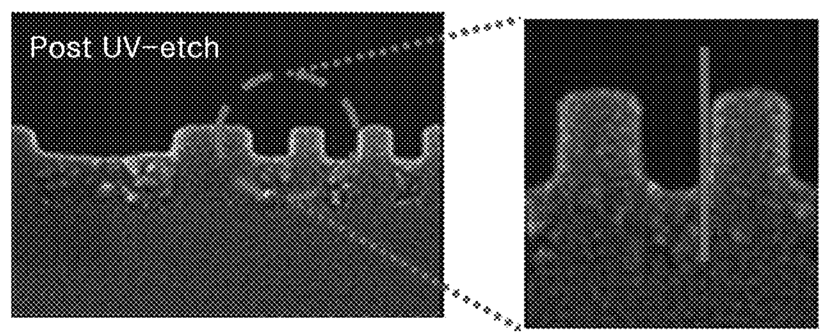
FIGS. 11A and 11B are scanning electron microscope (SEM) images of a fine pattern after UV etching employed in an exemplary embodiment.
Figures 12A, 12B:
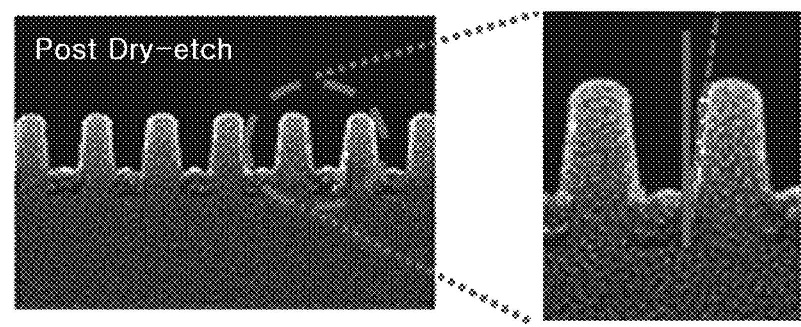
FIGS. 12A and 12B are SEM images of a fine pattern after dry etching employed in an exemplary embodiment.

FIGS. 11A and 11B are scanning electron microscope (SEM) images in which a vertical pattern B1 after UV etching was photographed, and FIGS. 12A and 12B are SEM images in which a vertical pattern B2 after dry etching was photographed.

As illustrated in FIGS. 11A and 11B, in the case of UV etching, a vertical pattern is hardly damaged, and a side surface which is vertical is almost maintained as it is. In the case of dry etching, as illustrated in FIGS. 12A and 12B, a vertical pattern is damaged, and a side surface, previously vertical, is confirmed to be deformed to be inclined.

As described above, UV etching is effective in removing an organic layer (a photoresist or a hardmask layer), in comparison with dry etching according to the related art, without damage to a substructure which is not an organic material.

As set forth above, according to exemplary embodiments, an upper layer (a photoresist pattern, or the like), an organic material, is decomposed by ozone or an oxygen radical obtained by irradiating ultraviolet light. In this way, while damage to a lower layer, an inorganic material, may be significantly reduced, the upper layer may be selectively removed. Therefore, an additional removal process of an anti-reflection film and/or a hardmask layer may be omitted, thereby simplifying a photoresist rework process.

While exemplary embodiments have been shown and described above, it will be apparent to those skilled in the art that modifications and variations could be made without departing from the scope of the present disclosure, as defined by the appended claims.

What is claimed is:

1. A method of manufacturing a semiconductor device comprising:

forming a hardmask layer on a semiconductor substrate;

forming a silicon-containing anti-reflection film on the hardmask layer;

baking the silicon-containing anti-reflection film using ultraviolet (UV) light in an oxygen-containing atmosphere to decompose an organic component in the silicon-containing anti-reflection film;

forming a first photoresist pattern on the-silicon-containing anti-reflection film, after baking the silicon-containing anti-reflection film;

removing the first photoresist pattern from the silicon-containing anti-reflection film by irradiating the UV light in the oxygen-containing atmosphere; and forming a second photoresist pattern on the-silicon-containing anti-reflection film, wherein the first photoresist pattern is removed by the irradiating the UV light without the first photoresist pattern being used as an etch mask.

2. The method of claim 1, wherein the silicon-containing anti-reflection film has a carbon content of 10 wt % or less, after the baking the silicon-containing anti-reflection film.

3. The method of claim 1, wherein the hardmask layer includes an organic compound.

4. A method of manufacturing a semiconductor device, comprising:

forming a first organic hardmask layer on a semiconductor substrate;

forming a first photoresist pattern on the first organic hardmask layer;

removing the first photoresist pattern and the first organic hardmask layer from the semiconductor substrate by generating ozone or an oxygen radical; and forming a second organic hardmask layer on the semiconductor substrate, wherein the first photoresist pattern is removed by the generating the ozone or the oxygen radical without the first photoresist pattern being used as an etch mask.

5. The method of claim 4, wherein each of the first organic hardmask layer and the second organic hardmask layer includes a spin-on hardmask.

6. The method of claim 4, further comprising, after the forming of the second organic hardmask layer, forming an anti-reflection film on the second organic hardmask layer and forming a second photoresist pattern on the anti-reflection film.

7. The method of claim 4, wherein the removing of the first photoresist pattern and the first organic hardmask layer includes irradiating UV light in an oxygen-containing atmosphere.

8. A method of manufacturing a semiconductor device, comprising the following processes:

forming an etch target layer including a hardmask layer and an anti-reflection film on a semiconductor substrate;

baking the anti-reflection film on the hardmask layer using ultraviolet (UV) light in an oxygen-containing atmosphere;

forming a first photoresist pattern on the etch target layer;

removing the first photoresist pattern, the hardmask layer, and the anti-reflection film by irradiating the UV light in the oxygen-containing atmosphere; and forming sequentially an additional hardmask layer, an additional anti-reflection film, and a second photoresist pattern on the semiconductor substrate.

9. The method of claim 8, wherein in the baking process a small amount of an organic compound contained in the anti-reflection film is decomposed in advance.

10. The method of claim 8, wherein the UV light used in the baking process has a wavelength capable of generating ozone.

11. The method of claim 10, wherein the baking process is carried out at a temperature ranging from 100° C. to 400° C.

12. The method of claim 1, further including:

prior to removing the first photoresist pattern, baking the silicon-containing anti-reflection film on the hardmask layer using UV light in an oxygen-containing atmosphere.

13. The method of claim 1, wherein the removing the first photoresist pattern from the silicon-containing anti-reflection film comprises removing the first photoresist pattern without removing the silicon-containing anti-reflection film.

* * * * *